(12) United States Patent
Oooka et al.

(10) Patent No.: US 11,502,210 B2
(45) Date of Patent: Nov. 15, 2022

(54) PHOTOELECTRIC CONVERSION ELEMENT AND METHOD OF MANUFACTURING THEREOF

(71) Applicants: KABUSHIKI KAISHA TOSHIBA, Tokyo (JP); Toshiba Energy Systems & Solutions Corporation, Kawasaki (JP)

(72) Inventors: Haruhi Oooka, Kawasaki (JP); Kenji Todori, Yokohama (JP); Kenji Fujinaga, Yokohama (JP)

(73) Assignees: KABUSHIKI KAISHA TOSHIBA, Tokyo (JP); Toshiba Energy Systems & Solutions Corporation, Kawasaki (JP)

(*) Notice: Subject to any disclaimer, the term of this patent is extended or adjusted under 35 U.S.C. 154(b) by 0 days.

(21) Appl. No.: 17/017,479

(22) Filed: Sep. 10, 2020

(65) Prior Publication Data
US 2020/0411704 A1    Dec. 31, 2020

Related U.S. Application Data

(63) Continuation of application No. PCT/JP2019/011604, filed on Mar. 19, 2019.

(51) Int. Cl.
*H01L 31/18*    (2006.01)
*H01L 31/0224*    (2006.01)
*H01L 31/032*    (2006.01)

(52) U.S. Cl.
CPC ........ *H01L 31/022475* (2013.01); *H01L 31/022483* (2013.01); *H01L 31/032* (2013.01); *H01L 31/1884* (2013.01)

(58) Field of Classification Search
CPC .......... H01L 31/0463; H01L 31/0465
See application file for complete search history.

(56) References Cited

U.S. PATENT DOCUMENTS 4,663,494 A * 5/1987 Kishi ............ H01L 31/022425
136/244
9,899,618 B2    2/2018 Oooka et al.
(Continued)

FOREIGN PATENT DOCUMENTS

JP    2-17858 U    2/1990
JP    4-130672 A    5/1992
(Continued)

OTHER PUBLICATIONS

International Search Report dated May 28, 2019 in PCT/JP2019/011604 filed Mar. 19, 2019 (with English Translation of Categories of Cited Documents, 3 pages.

*Primary Examiner* — Angelo Trivisonno
(74) *Attorney, Agent, or Firm* — Oblon, McClelland, Maier & Neustadt, L.L.P.

(57) ABSTRACT

A photoelectric conversion element includes: a first photoelectric conversion layer including: a bottom electrode; a photoelectric conversion layer; and a top electrode; and a second photoelectric conversion part including: a bottom electrode; a photoelectric conversion part; and a top electrode. A conductive layer is formed on the bottom electrode. The top electrode and the bottom electrode are electrically connected by a conductive portion and the conductive layer. The conductive portion is formed of a part of the top electrode filled in a first groove that makes a surface of the conductive layer exposed and separates a photoelectric conversion layer and a photoelectric conversion layer from each other. The top electrodes are physically separated by a second groove provided to make a step surface of a stepped portion provided in the photoelectric conversion layer exposed and have a bottom surface thereof overlap the surface of the conductive layer.

12 Claims, 7 Drawing Sheets

(56) References Cited

U.S. PATENT DOCUMENTS

| | | |
|---|---|---|
| 2012/0204931 A1 | 8/2012 | Seike |
| 2016/0104807 A1 | 4/2016 | Jeong |
| 2016/0276611 A1* | 9/2016 | Oooka .................. H01L 51/442 |
| 2019/0081194 A1 | 3/2019 | Oooka et al. |

FOREIGN PATENT DOCUMENTS

| | | |
|---|---|---|
| JP | 2001-237442 A | 8/2001 |
| JP | 5715795 B | 5/2015 |
| JP | 6030176 B | 11/2016 |
| JP | 2016-201486 A | 12/2016 |
| JP | 2018-56470 A | 4/2018 |
| JP | 2019-54086 A | 4/2019 |

* cited by examiner

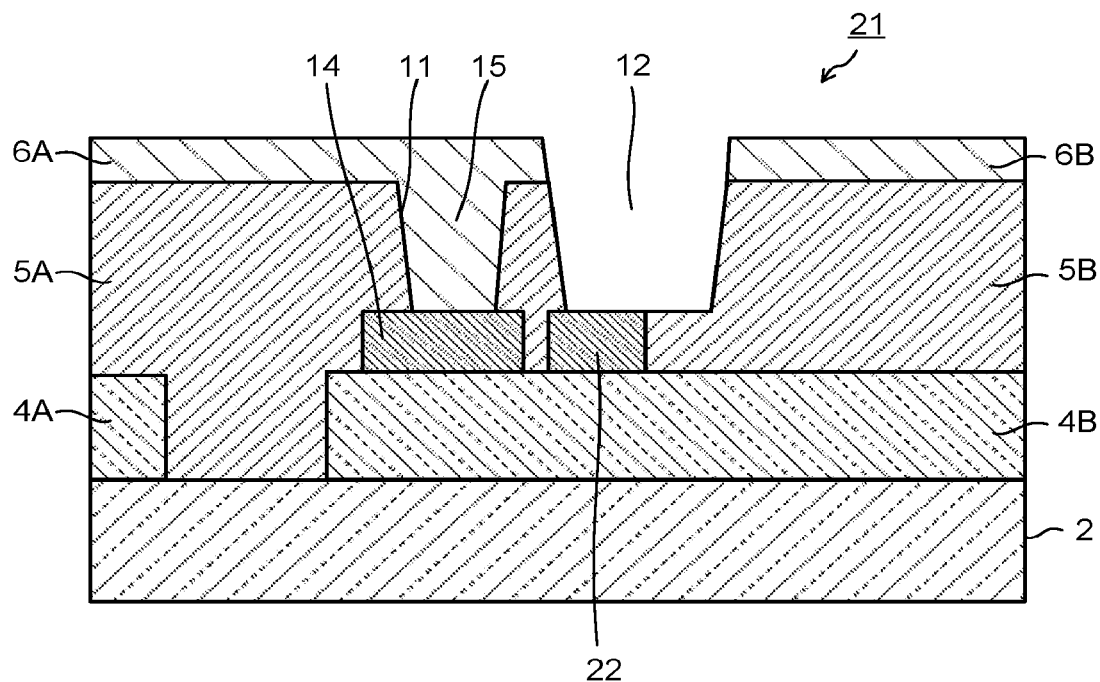
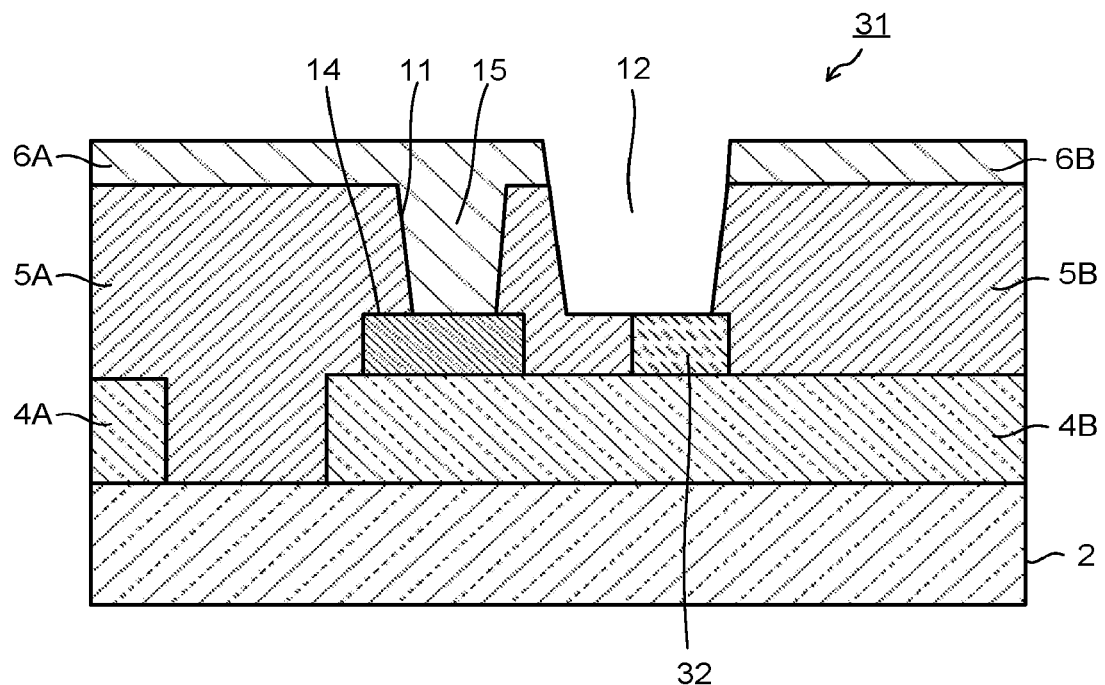

PHOTOELECTRIC CONVERSION ELEMENT AND METHOD OF MANUFACTURING THEREOF

CROSS REFERENCE TO RELATED APPLICATION

This application is a continuation of International Application No. PCT/JP2019/011604, filed Mar. 19, 2019; the entire contents of which are incorporated herein by reference.

FIELD

Embodiments relate to a photoelectric conversion element and a method of manufacturing thereof.

BACKGROUND

In photoelectric conversion elements used in solar batteries, light emitting elements, optical sensors, and so on, a photoelectric conversion part has a structure in which a photoelectric conversion layer is sandwiched between two electrodes, and a transparent electrode is used for at least one of the two electrodes. Currently, transparent electrodes at a practical level are not sufficiently conductive, so that the efficiency of extracting the generated charge to the outside decreases as the area of the photoelectric conversion part is enlarged. Thus, it is common to form a plurality of strip-shaped photoelectric conversion parts in a row and to connect the plural photoelectric conversion parts in series. A photoelectric conversion element module, such as a photovoltaics module having a plurality of photoelectric conversion parts, is formed by the following method, for example.

First, a photoelectric conversion layer is formed on the entire surface of a substrate such as a transparent substrate on which a plurality of strip-shaped bottom electrodes such as transparent electrodes are formed. The photoelectric conversion layer is patterned according to the number of photoelectric conversion parts to be provided, to make some of the bottom electrodes exposed. This is referred to as P2 patterning. Then, an electrode film is formed on the entire surface of the substrate, which serves as a top electrode such as a counter electrode. A stacked film of the photoelectric conversion layer and the electrode film is patterned, to divide the electrode film into multiple portions according to the number of photoelectric conversion parts to be provided. This is referred to as P3 patterning. The P3 patterning only needs to enable division of the electrode film basically, but when the conductivity of the photoelectric conversion layer is relatively high or the width of the P3 patterning is narrow, it is preferable to remove at least a part of the photoelectric conversion layer in the thickness direction with the electrode film in order to improve photoelectric conversion characteristics by breaking the conductivity between the adjacent photoelectric conversion layers.

The P3 patterning is performed by mechanical scribing using a cutting tool, for example. The stacked film is patterned by scanning a scribing blade while pressing the scribing blade against the stacked film of the electrode film and the photoelectric conversion layer, for example. At this time, burrs of the electrode film forming the top electrode may be pressed in the pressing direction of the scribing blade to come into contact with the bottom electrodes. If between the two burrs of the top electrode divided by a scribe groove, the burr of the photoelectric conversion part comes into contact with the bottom electrode, a short circuit is caused between the electrodes of the photoelectric conversion part, leading to a decrease in the photoelectric conversion characteristics. As the brittleness of the top electrode is lower or the expandability of the top electrode is higher, the burr is more likely to occur and the short circuit between the electrodes is more likely to occur. As compared to metal oxides such as indium tin oxide (ITO), for example, metals such as gold and silver, and organic composite materials such as silver paste are more likely to cause burrs.

Further, in the case where the bottom electrode has high brittleness or is soft, scanning while pressing the scribing blade against the stacked film causes cracking or scraping in the bottom electrode, resulting in lower conductivity and lower photoelectric conversion characteristics. For example, metal oxides such as ITO are more likely to crack than metals such as gold and silver, and further, conductive polymers such as poly(3,4-ethylenedioxythiophene)/poly(4-styrenesulfonate) (PEDOT/PSS) are more likely to be scraped. Further, in the case of using a soft substrate, the bottom electrode also tends to be deformed at the same time as the substrate is deformed when the scribing blade is pressed against the stacked film, and thus, the substrate is more likely to crack. In the meantime, in the case where the pressing pressure of the scribing blade is lowered so as to prevent cracking or scraping of the bottom electrode, the top electrode and the photoelectric conversion layer cannot be sufficiently removed to remain, failing to sufficiently break the conductivity between the adjacent photoelectric conversion parts, resulting in a decrease in the photoelectric conversion characteristics.

BRIEF DESCRIPTION OF THE DRAWINGS

FIG. 7 is a cross-sectional view illustrating a separation structure and a connection structure between photoelectric conversion parts in a photoelectric conversion element in a second embodiment.

FIG. 8 is a cross-sectional view illustrating a separation structure and a connection structure between photoelectric conversion parts in a photoelectric conversion element in a third embodiment.

DETAILED DESCRIPTION

Figure 1:
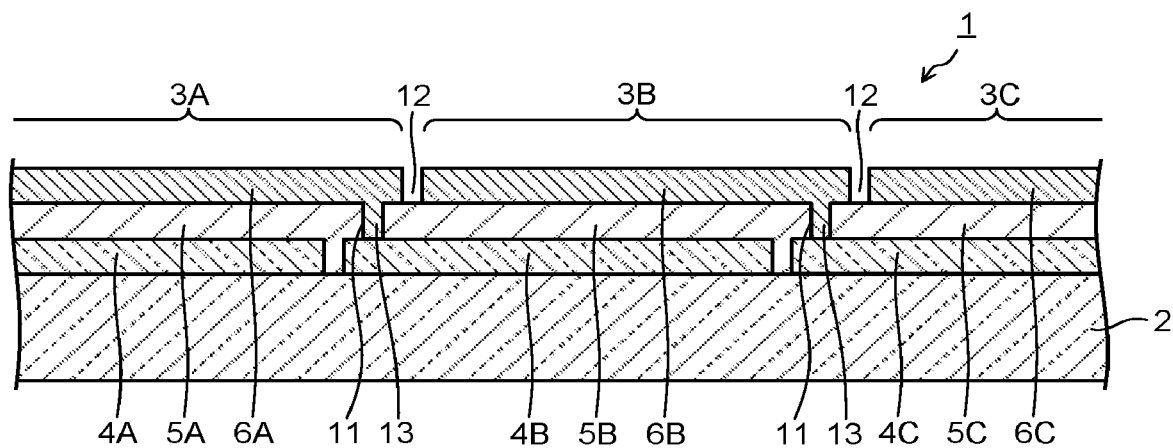
FIG. 1 is a cross-sectional view illustrating a schematic structure of a photoelectric conversion element according to a first embodiment.

A problem to be solved by the embodiment is to provide a photoelectric conversion element whose photoelectric conversion characteristics are improved by suppressing a short circuit between a top electrode and a bottom electrode, and the like when connecting a plurality of photoelectric conversion parts in series, and a manufacturing method thereof.

A photoelectric conversion element in an embodiment includes: a substrate; a first photoelectric conversion part including: a first bottom electrode provided on the substrate; a first photoelectric conversion layer arranged on the first bottom electrode; and a first top electrode arranged on the first photoelectric conversion layer; a second photoelectric conversion part including: a second bottom electrode provided on the substrate adjacently to the first bottom electrode and physically separated from the first bottom electrode; a conductive layer that is formed on a partial region, of the second bottom electrode, adjacent to the first bottom electrode; a second photoelectric conversion layer arranged on the second bottom electrode and the conductive layer; and a second top electrode arranged on the second photoelectric conversion layer; a connection part that includes a first groove and a conductive portion, the first groove provided to make a first surface region being a part of a surface of the conductive layer exposed and separate the first photoelectric conversion layer and the second photoelectric conversion layer from each other, and the conductive portion formed of a part of the first top electrode, filled in the first groove, and the connection part electrically connecting the first top electrode and the second bottom electrode via the conductive portion and the conductive layer; and a second groove provided to separate the first top electrode and the second top electrode from each other, the second groove provided to make a step surface of a stepped portion that is provided on the first photoelectric conversion layer side in the second photoelectric conversion layer exposed and have a bottom surface thereof overlap a second surface region being a part of the surface of the conductive layer on the second photoelectric conversion layer side.

Hereinafter, a photoelectric conversion element in each embodiment and a method of manufacturing thereof will be explained with reference to the drawings. Note that, in each of the embodiments, substantially the same constituent parts are denoted by the same reference numerals and symbols and their explanations will be partly omitted in some cases. The drawings are schematic, and a relation of thickness and planar dimension, a thickness ratio among parts, and so on are sometimes different from actual ones. Terms indicating up and down directions and so on in the explanation indicate relative directions when a surface, of a later-described substrate, where to form photoelectric conversion parts is defined as an up direction, unless otherwise noted, and they are sometimes different from actual directions based on a gravitational acceleration direction.

First Embodiment

FIG. 1 illustrates a schematic structure of a photoelectric conversion element in a first embodiment. A photoelectric conversion element 1 illustrated in FIG. 1 includes a substrate 2 and a plurality of photoelectric conversion parts 3 (3A, 3B, 3C) provided on the substrate 2. The photoelectric conversion parts 3 each include a bottom electrode 4 (4A, 4B, 4C), a photoelectric conversion layer 5 (5A, 5B, 5C), and a top electrode 6 (6A, 6B, 6C) that are formed on the substrate 2 in order. A transparent electrode is used for at least one of the bottom electrode 4 and the top electrode 6, thereby allowing light to enter the photoelectric conversion layer 5 or allowing light to be emitted from the photoelectric conversion layer 5, which enables the photoelectric conversion element 1 such as a photovoltaics, a light emitting element, or an optical sensor to function. Here, there will be explained an example where a transparent substrate is used for the substrate 2, a transparent electrode is used for the bottom electrode 4, and the top electrode 6 is a counter electrode mainly. However, this does not exclude the photoelectric conversion element 1, which uses a transparent electrode for the top electrode 6 and allows light to enter the photoelectric conversion layer 5 through the top electrode 6 or allows light to be emitted from the photoelectric conversion layer 5 through the top electrode 6, and in this case, the substrate 2 is not limited to a transparent substrate, but may be an opaque substrate.

The substrate 2 is formed of a material having a light transmitting property and insulation performance, for example. For the constituent material of the substrate 2, an inorganic material such as non-alkali glass, quartz glass, or sapphire, or a soft organic material such as polyethylene (PE), polyethylene terephthalate (PET), polyethylene naphthalate (PEN), polyimide, polyamide, polyamide-imide, or a liquid crystal polymer is used. For example, the substrate 2 may be a rigid substrate formed of an inorganic material or an organic material, or may be a flexible substrate formed of an organic material or a very thin inorganic material. In the case where the flexible substrate is applied to the substrate 2, the substrate 2 contains such a soft material as above.

The bottom electrode 4 is formed of a material having a light transmitting property and conductivity, for example. For the constituent material of the bottom electrode 4, a conductive metal oxide material such as indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), or indium-gallium-zinc oxide (IGZO), a conductive polymer material such as poly(3,4-ethylenedioxythiophene)/poly(4-styrenesulfonate) (PEDOT/PSS), or a carbon material such as graphene can be used. For the bottom electrode 4, a mixed material in which a nano conductive material such as a silver nanowire, a gold nanowire, or a carbon nanotube is mixed in any of the materials described above may be used. Further, the bottom electrode 4 may be a stacked film of a layer formed of any of the materials described above and a metal layer formed of metal such as gold, platinum, silver, copper, cobalt, nickel, indium, or aluminum, or an alloy containing any of these metals, within a range capable of maintaining the light transmitting property. The bottom electrode 4 is formed by, for example, a vacuum deposition method, a sputtering method, an ion plating method, a CVD method, a sol-gel method, a plating method, a coating method, or the like.

The thickness of the bottom electrode 4 is not particularly limited, but is preferably 10 nm or more and 1 μm or less, and further preferably 30 nm or more and 300 nm or less. When the film thickness of the bottom electrode 4 is too thin, sheet resistance becomes high. When the film thickness of the bottom electrode 4 is too thick, light transmittance decreases and flexibility decreases, so that a crack or the like is likely to occur due to stress. It is preferable to select the film thickness of the bottom electrode 4 so that high light transmittance and low sheet resistance both can be obtained. The sheet resistance of the bottom electrode 4 is not particularly limited, but is normally 1000 Ω/□ or less, preferably 500 Ω/□ or less, and more preferably 200 Ω/□ or less. In the case of a current driven type element such as a photovoltaics or a light emitting element, the sheet resistance is further preferably 50 Ω/□ or less.

Figure 2:
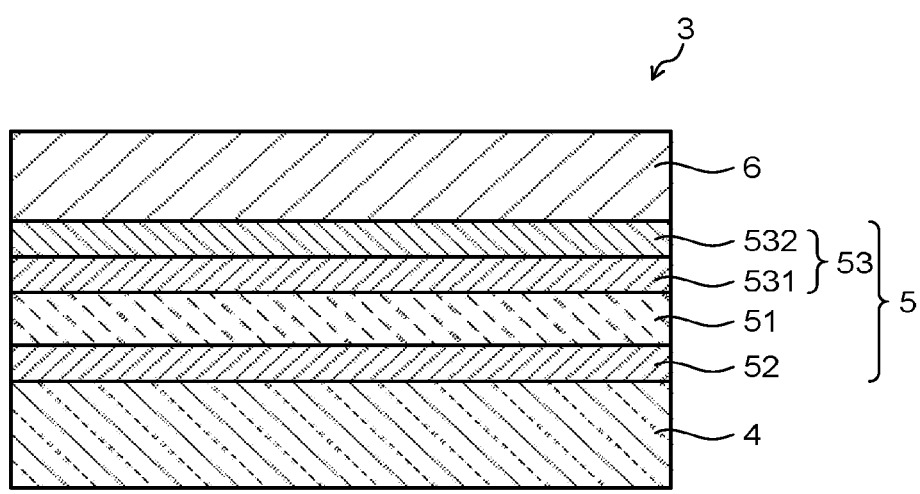
FIG. 2 is a cross-sectional view illustrating a photoelectric conversion part in the photoelectric conversion element illustrated in FIG. 1 in an enlarged manner.

The photoelectric conversion layer 5 includes, as illustrated in FIG. 2, an active layer 51, a bottom electrode side intermediate layer 52 arranged between the bottom electrode 4 and the active layer 51, and a top electrode side intermediate layer 53 arranged between the active layer 51 and the top electrode 6. The top electrode side intermediate layer 53 may include a first top electrode side intermediate layer 531 and a second top electrode side intermediate layer 532. The bottom electrode side intermediate layer 52 and the top electrode side intermediate layer 53 are arranged as necessary, and in some cases, all or part of them may be excluded. The respective layers 51, 52, and 53 composing the photoelectric conversion layer 5 are selected appropriately according to a device (a photovoltaics, a light emitting element, an optical sensor, or the like) to which the photoelectric conversion element 1 is applied. There will be mainly explained the case where the photoelectric conversion element 1 is used as a photovoltaics below, but the photoelectric conversion element 1 in the embodiment is also applicable to a light emitting element, an optical sensor, or the like, and in this case, the materials of the respective layers are selected appropriately according to the device to which the photoelectric conversion element 1 is applied.

For the active layer 51 in the photoelectric conversion element 1 in the embodiment, arbitrary materials exhibiting the photoelectric conversion characteristics can be used. Examples of the material that exhibits the photoelectric conversion characteristics include an organic material (what is called an organic thin film photovoltaics material), a perovskite compound, silicon, CIS, GaAs, CdTe, and so on. Although details will be described later, the photoelectric conversion element 1 in the embodiment is effective when the hardness (Vickers hardness, or the like) of the material of the photoelectric conversion layer 5 is low, and therefore is suitable for the case of applying an organic material or a perovskite compound to the active layer 51 being a layer composing the photoelectric conversion layer 5.

In the case where the photoelectric conversion element 1 is applied to an organic thin film photovoltaics, the active layer 51 contains an organic semiconductor material and further contains a p-type semiconductor and an n-type semiconductor. For the p-type semiconductor in the active layer, a material having an electron donating property is used, and for the n-type semiconductor, a material having an electron accepting property is used. The p-type semiconductor and the n-type semiconductor forming the active layer 51 both may be an organic material or one of them may be an organic material.

As the p-type semiconductor contained in the active layer 51, it is possible to use polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, polythienylene vinylene and its derivative, or the like. These materials may be used in combination, or a mixture or a compound of any of these materials and another material may be used.

As the p-type semiconductor, polythiophene being a conductive polymer having a π-conjugated structure and its derivative are preferably used. Polythiophene and its derivative have excellent stereoregularity and are relatively high in solubility in a solvent. Polythiophene and its derivative are not particularly limited, provided that they are each a compound having a thiophene framework. Concrete examples of the polythiophene and its derivative include: polyalkylthiophene such as poly(3-methylthiophene), poly(3-butylthiophene), poly(3-hexylthiophene), poly(3-octylthiophene), or poly(3-decylthiophene); polyarylthiophene such as poly(3-phenylthiophene) or poly(3-(p-alkylphenyl-thiophene)); polyalkylisothionaphthene such as poly(3-butylisothionaphthene), poly(3-hexylisothionaphthene), poly(3-octylisothionaphthene), or poly(3-decylisothionaphthene); polyethylenedioxythiophene; poly[N-9'-heptadecanyl-2,7-carbazole-alt-5,5-(4,7-di-2-thienyl-2',1',3'-benzothiadiazole)] (PCDTBT); poly[4,8-bis{(2-ethylhexyl)oxy}benzo[1,2-b:4,5-b']dithiophene-2,6-diyl-1t-alt-3-fluoro-2-{(2-ethylhexyl)carbonyl)}thieno[3,4-b]thiophene-4,6-diyl] (PTB7); and so on.

As the n-type semiconductor contained in the active layer 51, fullerene, a fullerene derivative, or the like can be used. The fullerene derivative may be any, provided that it has a fullerene framework. Examples of the fullerene and the fullerene derivative include fullerene such as $C_{60}$, $C_{70}$, $C_{76}$, $C_{78}$, or $C_{84}$, fullerene oxide being any of these fullerenes whose carbon atoms at least partly are oxidized, a compound in which part of carbon atoms of a fullerene framework is modified by optional functional groups, a compound in which these functional groups are bonded to form a ring, and so on.

Examples of the functional group used for the fullerene derivative include: a hydrogen atom; a hydroxyl group; a halogen atom such as a fluorine atom or a chlorine atom; an alkyl group such as a methyl group or an ethyl group; an alkenyl group such as a vinyl group; a cyano group; an alkoxy group such as a methoxy group or an ethoxy group; an aromatic hydrocarbon group such as a phenyl group or a naphthyl group; an aromatic heterocyclic group such as a thienyl group or a pyridyl group; and so on. Concrete examples of the fullerene derivative include fullerene hydride such as $C_{60}H_{36}$ or $C_{70}H_{36}$, fullerene oxide being oxidized $C_{60}$ or $C_{70}$, a fullerene metal complex, and so on. As the fullerene derivative, [6,6]phenyl$C_{61}$butyric acid methyl ester (PC60BM), [6,6]phenyl$C_{71}$butyric acid methyl ester (PC70BM), bis-indene$C_{60}$ (60ICBA), or the like is preferably used.

The active layer 51 has a bulk hetero junction structure containing a mixture of a p-type semiconductor material and an n-type semiconductor material, for example. The active layer 51 of the bulk hetero junction type has a microphase-separated structure of the p-type semiconductor material and the n-type semiconductor material. In the active layer 51, a p-type semiconductor phase and an n-type semiconductor phase are physically separated from each other and form a pn junction on a nano order. When the active layer 51 absorbs light, positive charges (holes) and negative charges (electrons) are physically separated on an interface of these phases and they are transported to the electrodes 4, 6 through the respective semiconductors. The active layer 51 of the bulk hetero junction type is formed by applying a solution in which the p-type semiconductor material and the n-type semiconductor material are dissolved in a solvent, on the transparent substrate 2 having the bottom electrode 4, and so on. The thickness of the active layer 51 is not particularly limited, but is preferably 10 nm or more and 1000 nm or less.

In the case where the photoelectric conversion element 1 in the embodiment is applied to a perovskite photovoltaics, the active layer 51 contains, for example, a perovskite compound. As the perovskite compound, a compound having a composition expressed by $ABX_3$, for example, is cited. The A site is a monovalent cation, the B site is a divalent cation, and X site is a monovalent anion. As the A site, an organic amine compound such as $CH_3NH_4$, cesium, rubidium, and so on are cited. As the B site, lead, tin, and so on are cited. As the X site, halogen elements such as iodine, bromine, and chlorine are cited. The sites of A, B, and X each are not limited to a single material, but may be a mixture of two or more materials. An example of the X site may be a mixture of iodine and bromine. Further, in the case of a mixture, the sum of the mixture only needs to match the composition formula. When the case of using a mixture of iodine (I) and bromine (Br) for the X site is taken as an example and the composition formula is expressed by $ABI_xBr_y$, x+y=3 only needs to be satisfied.

Examples of a method of forming the active layer 51 include a method of vacuum depositing the above-described perovskite compound or its precursor, and a method of applying a solution in which the perovskite compound or its precursor is dissolved in a solvent, followed by heating and drying. Examples of the precursor of the perovskite compound include a mixture of methylammonium halide and lead halide or tin halide. The thickness of the active layer 51 is not particularly limited, but is preferably 10 nm or more and 1000 nm or less.

In the case where, out of the electrons and the holes generated in the photoelectric conversion layer 5, the electrons are collected in the bottom electrode 4, the bottom electrode side intermediate layer 52 is formed of a material capable of selectively and efficiently transporting the electrons. As the constituent material of the bottom electrode side intermediate layer 52 functioning as an electron transport layer, inorganic materials such as zinc oxide, titanium oxide, and gallium oxide, organic materials such as polyethyleneimine and its derivative, and carbon materials such as the above-described fullerene derivative are cited, and the constituent material is not particularly limited.

In the case where the holes are collected in the bottom electrode 4, the bottom electrode side intermediate layer 52 is formed of a material capable of selectively and efficiently transporting the holes. As the constituent material of the bottom electrode side intermediate layer 52 functioning as a hole transport layer, inorganic materials such as nickel oxide, copper oxide, vanadium oxide, tantalum oxide, and molybdenum oxide, and organic materials such as polythiophene, polypyrrole, polyacetylene, triphenylenediaminepolypyrrol, polyaniline, and derivatives of these are cited, and the constituent material is not particularly limited.

In the case where, out of the electrons and the holes generated in the photoelectric conversion layer 5, the holes are collected in the top electrode 6, the top electrode side intermediate layer 53, which is, for example, the first and second top electrode side intermediate layers 531, 532, is formed of a material capable of selectively and efficiently transporting the holes. The constituent material of the top electrode side intermediate layer 53 (531, 532) functioning as the hole transport layer is the same as that of the bottom electrode side intermediate layer 52. In the case where the electrons are collected in the top electrode 6, the top electrode side intermediate layer 53 (first and second top electrode side intermediate layers 531, 532) is formed of a material capable of selectively and efficiently transporting the electrons. The constituent material of the top electrode side intermediate layer 53 functioning as the electron transport layer is the same as that of the bottom electrode side intermediate layer 52.

The bottom electrode side intermediate layer 52 and the top electrode side intermediate layer 53 (531, 532) are formed by, for example, a vacuum deposition method, a sputtering method, an ion plating method, a CVD method, a sol-gel method, a plating method, a coating method, or the like. The bottom electrode side intermediate layer 52 and the top electrode side intermediate layer 53 (531, 532) each preferably have a thickness of 1 nm or more and 200 nm or less.

The top electrode 6 functions as a counter electrode of the bottom electrode 4. The top electrode 6 is formed of a material having conductivity, and in some cases, having a light transmitting property. As the constituent material of the top electrode 6, there is used metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these metals, a conductive metal oxide such as indium-zinc oxide (IZO), a conductive polymer such as PEDOT/PSS, a carbon material such as graphene or carbon nanotube, or the like, for example. For the top electrode 6, there may be used a mixed material in which a nano conductive material such as a silver nanowire, a gold nanowire, or a carbon nanotube is mixed in any of the materials described above.

The top electrode 6 is formed by, for example, a vacuum deposition method, a sputtering method, an ion plating method, a sol-gel method, a plating method, a coating method, or the like. The thickness of the top electrode 6 is not particularly limited, but is preferably 1 nm or more and 1 μm or less. When the film thickness of the top electrode 6 is too thin, resistance becomes too high, which may make it impossible to sufficiently transmit the generated electric charges to an external circuit. When the thickness of the top electrode 6 is too thick, its film formation takes a long time and accordingly a material temperature increases, which may damage the active layer 51. Sheet resistance of the top electrode 6 is not particularly limited, but is preferably 500 Ω/□ or less, and more preferably 200 Ω/□ or less. In the case of a current driven type element such as a photovoltaics or a light emitting element, the sheet resistance is further preferably 50 Ω/□ or less.

In the photoelectric conversion element 1 in the first embodiment, the first photoelectric conversion layer 5A in the first photoelectric conversion part 3A and the second photoelectric conversion layer 5B in the second photoelectric conversion part 3B are physically separated by a first groove 11, and the second photoelectric conversion layer 5B in the second photoelectric conversion part 3B and the third photoelectric conversion layer 5C in the third photoelectric conversion part 3C are physically separated by a first groove 11. The first top electrode 6A in the first photoelectric conversion part 3A and the second top electrode 6B in the second photoelectric conversion part 3B are physically separated by a second groove 12, and the second top electrode 6B in the second photoelectric conversion part 3B and the third top electrode 6C in the third photoelectric conversion part 3C are physically separated by a second groove 12. Further, the first top electrode 6A in the first photoelectric conversion part 3A and the second bottom electrode 4B in the second photoelectric conversion part 3B are connected in series by a connection part 13, and the second top electrode 6B in the second photoelectric conversion part 3B and the third bottom electrode 4C in the third photoelectric conversion part 3C are connected in series by a connection part 13.

There will be explained a manufacturing step of the photoelectric conversion element 1 in the embodiment including details of a separation structure by the first groove 11 and the second groove 12 and a connection structure by the connection part 13, which are described above, with reference to FIG. 3A to FIG. 3E and FIG. 4. Incidentally, FIG. 3A to FIG. 3E illustrate the manufacturing step including the separation structure and the connection structure of the photoelectric conversion part 3A and the photoelectric conversion part 3B adjacent thereto, but the same is applied also to the manufacturing step including the separation structure and the connection structure of the photoelectric conversion part 3B and the photoelectric conversion part 3C adjacent thereto. Further, the same is applied also to the case where the photoelectric conversion element 1 includes four or more photoelectric conversion parts 3, and the separation and the connection between the adjacent photoelectric conversion parts 3 are performed by the same structure and step.

Figure 3A:
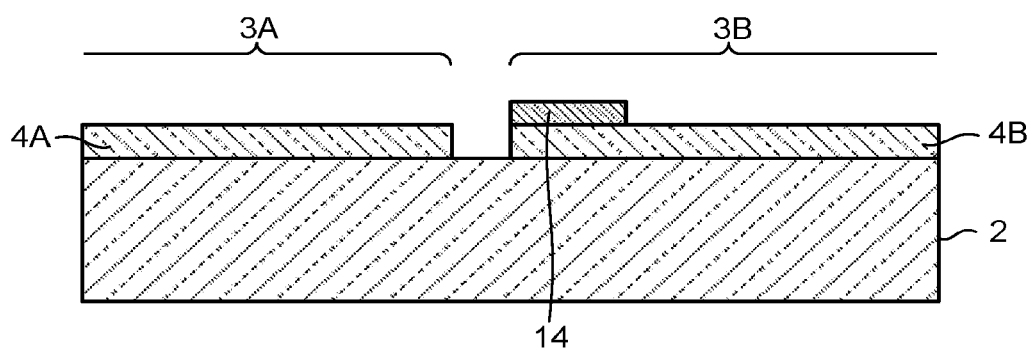
FIG. 3A is a cross-sectional view illustrating a manufacturing step of the photoelectric conversion element illustrated in FIG. 1.

First, as illustrated in FIG. 3A, on the substrate 2, the bottom electrodes 4A, 4B according to a plurality of the photoelectric conversion parts 3A, 3B are formed. The bottom electrode 4B is formed in a state of being adjacent to the bottom electrode 4A and being physically separated from the bottom electrode 4A. Then, a conductive layer 14 is formed on the bottom electrode 4B. The conductive layer 14 functions as a formation region of the first groove 11, a partial formation region of the second groove 12, and a base layer of these grooves 11 and 12 when constituent material layers of the photoelectric conversion layer 5 and the top electrode 6 are, for example, scribed to form the grooves 11 and 12. Thus, the conductive layer 14 is formed only on the region of the bottom electrode 4B corresponding to scribed regions of the photoelectric conversion layer and the top electrode. The conductive layer 14 is formed only on a partial region of the bottom electrode 4B adjacent to the bottom electrode 4A. The constituent material and the formation range of the conductive layer 14 will be described in detail later.

Figure 3B:
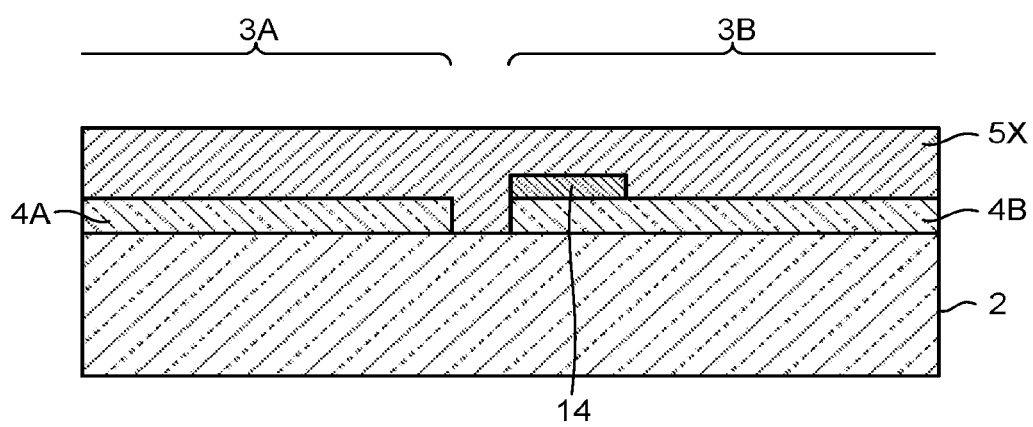
FIG. 3B is a cross-sectional view illustrating the manufacturing step of the photoelectric conversion element illustrated in FIG. 1.
Figure 3C:
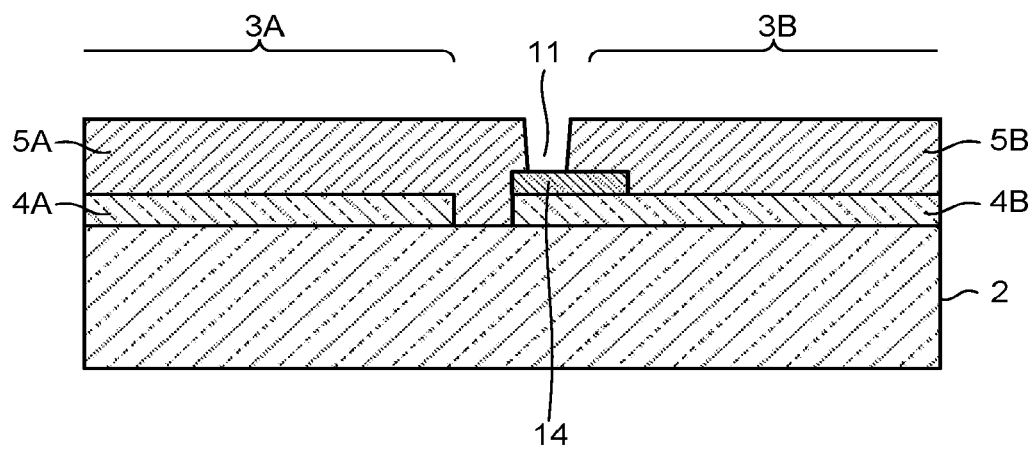
FIG. 3C is a cross-sectional view illustrating the manufacturing step of the photoelectric conversion element illustrated in FIG. 1.

Then, as illustrated in FIG. 3B, a photoelectric conversion material film 5X, which is to be the photoelectric conversion layer 5, is formed on the substrate 2 so as to cover the bottom electrodes 4A, 4B and the conductive layer 14. The photoelectric conversion material film 5X is formed on the entire surface so as to cover the entire region of the bottom electrodes 4A, 4B including the conductive layer 14. Then, as illustrated in FIG. 3C, the first groove 11 is formed by cutting the photoelectric conversion material film 5X so as to divide the photoelectric conversion material film 5X into a plurality of parts corresponding to the respective photoelectric conversion parts 3A, 3B. The first groove 11 dividing the photoelectric conversion material film 5X is formed by, for example, a mechanical scribing method or a laser scribing method. The photoelectric conversion material film 5X is divided into a plurality of parts by the first groove (scribe groove) 11, and thereby the photoelectric conversion layers 5A, 5B corresponding to a plurality of the photoelectric conversion parts 3A, 3B are formed. The first groove 11 serves as a region where to form the connection part 13 for electrically connecting the top electrode 6A in the photoelectric conversion part 3A with the bottom electrode 4B in the adjacent photoelectric conversion part 3B. Thus, the first groove 11 is formed so as to make the surface of the conductive layer 14 formed on the bottom electrode 4B exposed.

In the case where the mechanical scribing is applied to the formation of the first groove 11, a scribing blade is pressed against the surface of the photoelectric conversion material film 5X located on the formation region of the conductive layer 14 and the scribing blade is scanned in a direction along the formation region of the conductive layer 14 (a direction vertical to the paper (depth direction) of FIG. 3C) to scrape off the photoelectric conversion material film 5X, to thereby make the conductive layer 14 exposed. At this time, the pressing pressure and the scanning condition of the scribing blade are adjusted, thereby making it possible to regulate a penetration depth of the scribing blade at the position of the surface of the conductive layer 14. As a result, it is possible to set the depth of the first groove 11 up to the surface of the conductive layer 14. The first groove 11 is formed in order to, as one purpose, divide the photoelectric conversion material film 5X into the photoelectric conversion layer 5A and the photoelectric conversion layer 5B and electrically separate them from each other. Thus, in order to enhance separability of the photoelectric conversion material film 5X, the first groove 11 may be formed so as to scrape off the photoelectric conversion material film 5X up to a portion of the conductive layer 14 in the thickness direction.

Figure 3D:
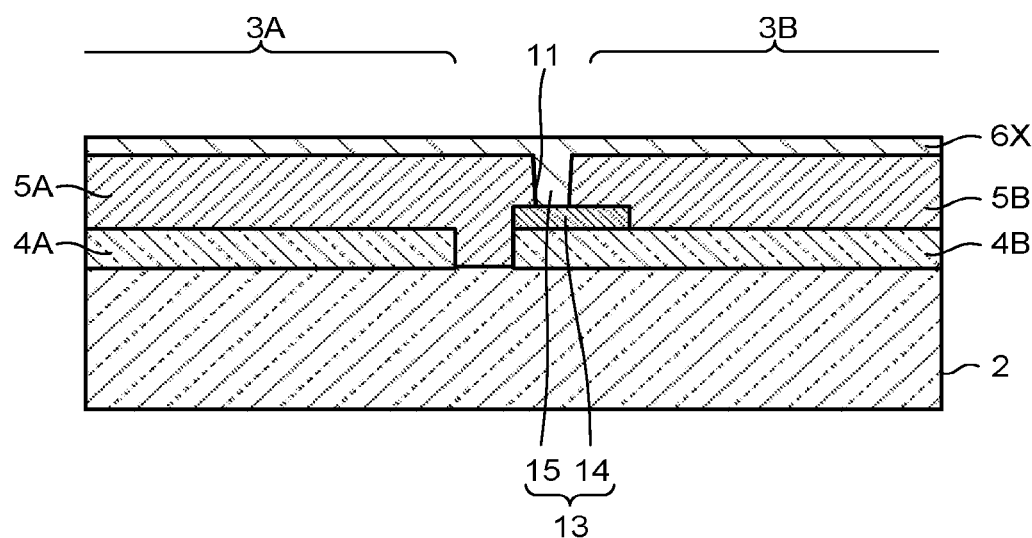
FIG. 3D is a cross-sectional view illustrating the manufacturing step of the photoelectric conversion element illustrated in FIG. 1.

Then, as illustrated in FIG. 3D, an electrode film 6X, which is to be the top electrodes 6A, 6B, is formed on the photoelectric conversion layers 5A, 5B. In order to form the electrode film 6X, a part of the electrode film 6X (a top electrode material 15) is filled in the first groove 11 provided between the adjacent photoelectric conversion parts 3A and 3B. As above, the electrode film 6X and the bottom electrode 4B in the photoelectric conversion part 3B are electrically connected by the connection part 13 composed of the top electrode material 15 filled in the first groove 11 and the conductive layer 14 connected to the top electrode material 15. The electrode film 6X is divided into parts corresponding to the photoelectric conversion parts 3A, 3B in a subsequent step. Thus, after the electrode film 6X is divided, the top electrode 6A in the photoelectric conversion part 3A and the bottom electrode 4B in the adjacent photoelectric conversion part 3B are electrically connected by the connection part 13 composed of the top electrode material 15 and the conductive layer 14.

Figure 3E:
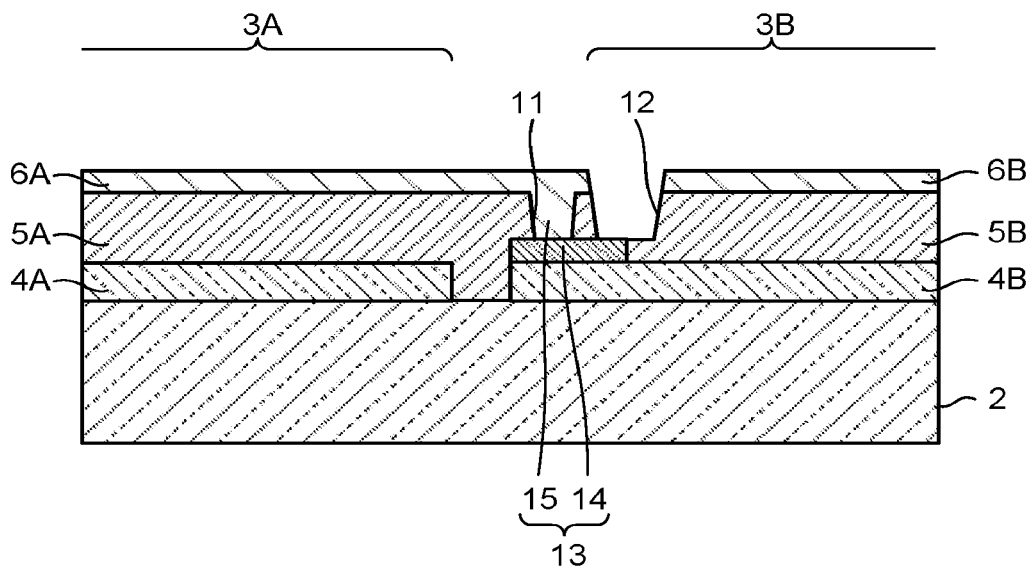
FIG. 3E is a cross-sectional view illustrating the manufacturing step of the photoelectric conversion element illustrated in FIG. 1.

Then, as illustrated in FIG. 3E, the second groove 12 is formed by cutting the electrode film 6X so as to divide the electrode film 6X into a plurality of parts corresponding to the respective photoelectric conversion parts 3A, 3B. The second groove 12 dividing the electrode film 6X is formed by, for example, a mechanical scribing method or a laser scribing method. The electrode film 6X is divided into a plurality of parts by the second groove (scribe groove) 12, and thereby the top electrodes 6A, 6B corresponding to a plurality of the photoelectric conversion parts 3A, 3B are formed. The second groove 12 is formed at a position on the photoelectric conversion layer 5B side relative to the connection part 13 that electrically connects the top electrode 6A and the bottom electrode 4B, the electrode film 6X is divided at this position, and thereby the top electrode 6A in the photoelectric conversion part 3A and the top electrode 6B in the photoelectric conversion part 3B are formed.

Figure 4:
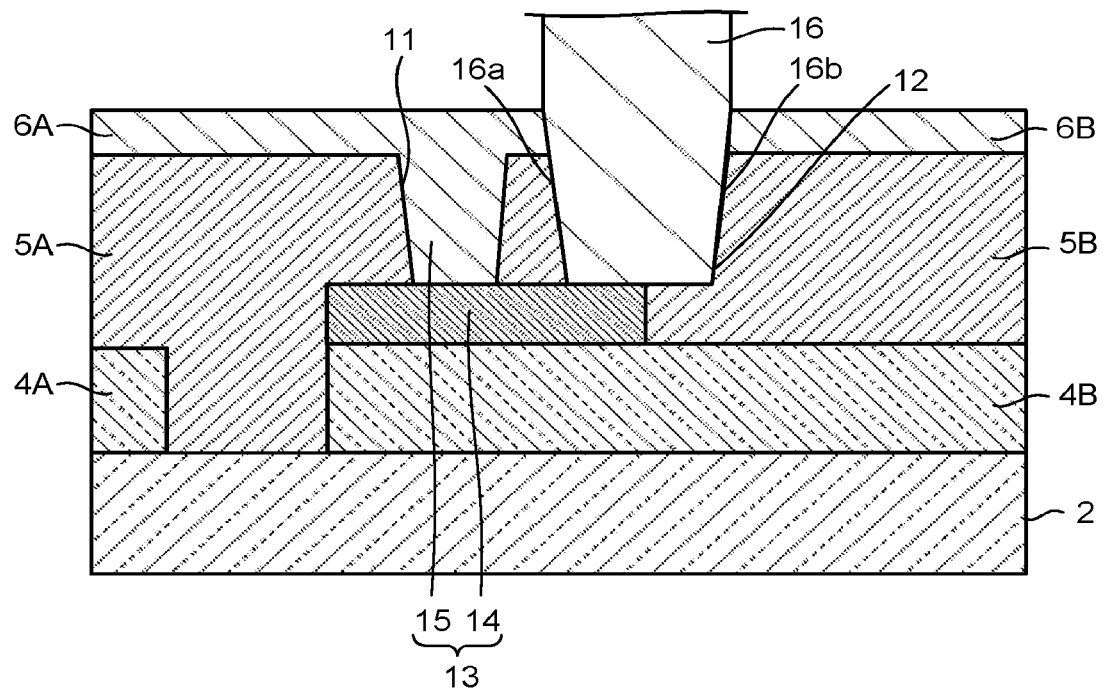
FIG. 4 is a cross-sectional view illustrating a forming step of a second groove in the manufacturing step of the photoelectric conversion element in the first embodiment in an enlarged manner.

The second groove 12 is formed so as to remove a part in the thickness direction of the photoelectric conversion layer 5B at the side closer to the photoelectric conversion layer 5A and to have a bottom surface thereof flush with a part of a surface of the conductive layer 14. A forming step of the second groove 12 is illustrated in FIG. 4 in an enlarged manner. As illustrated in FIG. 4, a scribing blade 16 is pressed against the surface of the electrode film 6X so that one end of a blade surface of the scribing blade 16 (the left end of the paper/a first end portion 16a) is placed on the electrode film 6X located at the top of the region where the conductive layer 14 in the photoelectric conversion layer 5B is present and the other end of the blade surface (the right end of the paper/a second end portion 16b) is placed on the electrode film 6X located at the top of the region where the conductive layer 14 in the photoelectric conversion layer 5B is not present. In this state, the scribing blade 16 is scanned in the direction along the formation region of the conductive layer 14 (in the direction vertical to the paper (depth direction) of FIG. 4) to scrape off the electrode film 6X, to thereby form the second groove 12 that divides the electrode film 6X. The second groove 12 is preferably formed so as to make at least a part of the surface of the conductive layer 14 exposed.

Figure 5:
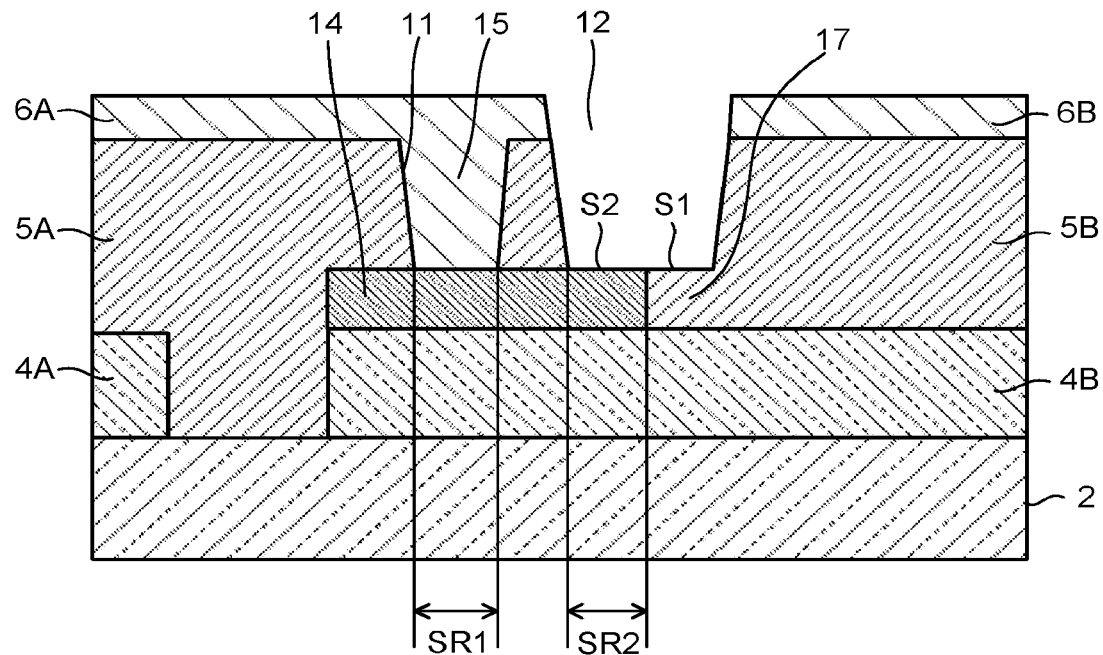
FIG. 5 is a cross-sectional view illustrating a separation structure and a connection structure between photoelectric conversion parts in the photoelectric conversion element in the first embodiment.

At this time, in the case where the conductive layer 14 is harder than the photoelectric conversion layer 5B, the pressing pressure and the scanning condition of the scribing blade 16 are adjusted, to thereby regulate the penetration depth of the scribing blade 16 at the position of the surface of the conductive layer 14. As a result, as illustrated in FIG. 5, it is possible to set the depth of the second groove 12 up to the position of the surface of the conductive layer 14. Having the second end portion 16b thereof placed on the region where the conductive layer 14 in the photoelectric conversion layer 5B is not present, the scribing blade 16 scrapes off the electrode film 6X and then a part of the photoelectric conversion layer 5B in the thickness direction, and when the edge of the scribing blade 16 is regulated at the surface of the conductive layer 14, the surface of the scraped part of the photoelectric conversion layer 5B in the thickness direction (the surface of the photoelectric conversion layer 5B) is exposed to the inside of the second groove 12. At this time, in order to bring the edge of the scribing blade 16 into a state regulated at the surface of the conductive layer 14, at least a part of the surface of the conductive layer 14 is preferably exposed to the inside of the second groove 12. However, the surface of the conductive layer 14 does not need to be exposed to the inside of the second groove 12, and in order to prevent a short circuit in the later-described photoelectric conversion part 3B, the surface of the photoelectric conversion layer 5B only needs to be exposed to the inside of the second groove 12.

As described above, while regulating the depth of the second groove 12 at the surface of the conductive layer 14, a part of the region in the thickness direction where the conductive layer 14 in the photoelectric conversion layer 5B is not present is scraped off, and thereby a stepped portion, namely, a remaining portion of the photoelectric conversion layer 5B that remains after a part of the photoelectric conversion layer 5B is scraped off (a remaining photoelectric conversion layer) 17 is provided on the photoelectric conversion layer 5A side in the photoelectric conversion layer 5B. A step surface S1 of the stepped portion 17 and a surface S2 of the conductive layer 14, which continues from the step surface S1, are formed inside the second groove 12. That is, inside the second groove 12, the surface S1 of the photoelectric conversion layer 5B and the surface S2 of the conductive layer 14 are formed, the surface S2 of the conductive layer 14 is located on the photoelectric conversion part 3A side, and at the same time, the surface S1 of the photoelectric conversion layer 5B is located on the photoelectric conversion part 3B side relative to the surface S2. FIG. 5 illustrates the state where the surface S1 of the photoelectric conversion layer 5B and the surface S2 of the conductive layer 14 are present inside the second groove 12, but this embodiment is not limited to this state and the photoelectric conversion layer 5B may remain on at least a part of the surface S2 of the conductive layer 14. The second groove 12 only needs to be formed so as to have the bottom surface thereof overlap the surface S2 of the conductive layer 14.

Figure 6:
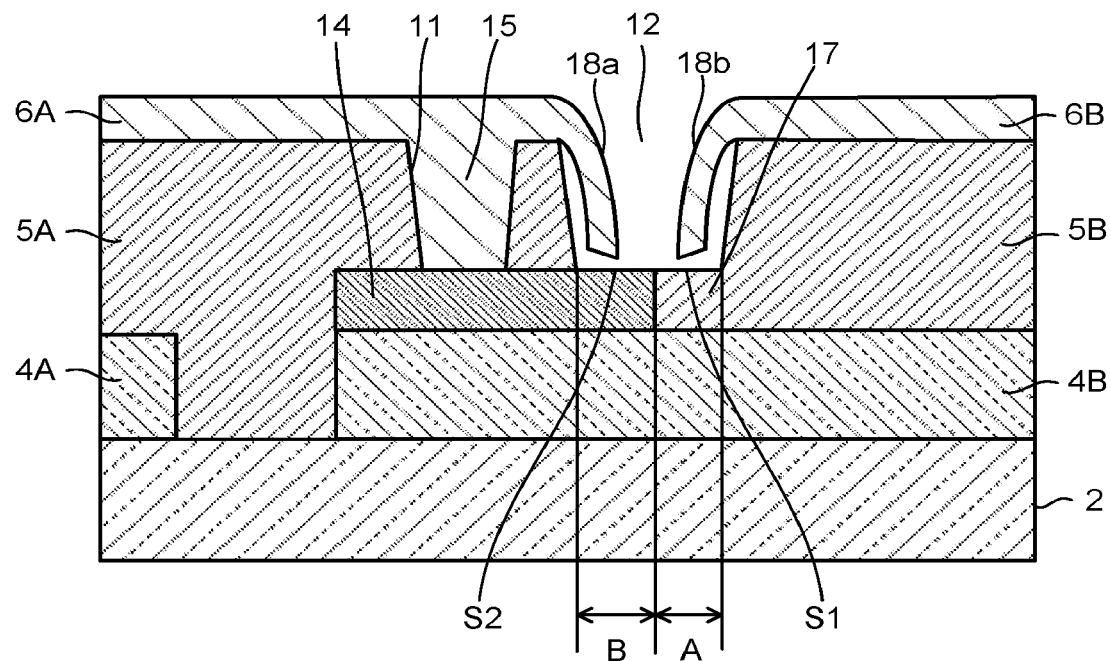
FIG. 6 is a cross-sectional view illustrating the separation structure and the connection structure between the photoelectric conversion parts in the photoelectric conversion element in the first embodiment.

As illustrated in FIG. 4, when the scribing blade 16 is pressed against the electrode film 6X and scanned, a part of the electrode film 6X may be torn off and pattern-removed, and a part of the rest may go into the second groove 12 along the sides of the scribing blade 16. As a result, as illustrated in FIG. 6, burrs of the electrode film 6X, namely two burrs 18a, 18b occur in some cases. If the burr 18b on the photoelectric conversion part 3B side between the two burrs 18a and 18b comes into contact with the bottom electrode 4B, a short circuit occurs in the photoelectric conversion part 3B and the photoelectric conversion characteristics decrease. In terms of such a point, in this embodiment, the stepped portion 17 is formed in the photoelectric conversion layer 5B by the second groove 12 to prevent exposure of the bottom electrode 4B, so that even if the burr 18b hangs down into the second groove 12, the burr 18b only comes into contact with the surface S1 of the stepped portion 17 of the photoelectric conversion layer 5B. Thus, it is possible to prevent a short circuit between the bottom electrode 4B and the top electrode 6B in the photoelectric conversion part 3B.

As described above, a material harder than that of the photoelectric conversion layer 5 only needs to be applied to the conductive layer 14 in order to form the stepped portion (remaining photoelectric conversion layer) 17 in the photoelectric conversion layer 5B. The properties required of the conductive layer 14 are the hardness required to regulate the penetration depth of the scribing blade 16 and the conductivity to avoid interfering with conductivity between the top electrode 6A and the bottom electrode 4B. As the material satisfying these two properties simultaneously, there can be cited metal materials made of metals such as aluminum, gold, silver, copper, platinum, bismuth, lead, tin, zinc, iron, cobalt, nickel, titanium, zirconium, molybdenum, tungsten, chromium, and tantalum and alloys containing these metals, carbon materials such as graphene, and a composite material (a metal-polymer composite or a carbon-polymer composite) in which a powder of particles, fibers, or the like of the above-described metal material or carbon material is dispersed in a polymeric material. The conductive layer 14 may be a stacked film of a plurality of metal layers, or a stacked film of a metal material layer and a carbon material layer or the like. To the conductive layer 14, there may be applied a stacked film of a layer of a highly conductive material such as a metal material such as gold, platinum, silver, copper, bismuth, lead, tin, zinc, iron, cobalt, or nickel, a metal-polymer composite, or a carbon-polymer composite and a layer of a material having a large hardness such as iron, cobalt, nickel, titanium, zirconium, molybdenum, tungsten, chromium, or tantalum, or the like.

As described above, it is preferable to apply the photoelectric conversion layer 5 that is softer (has a hardness smaller) than the conductive layer 14, in order to form the stepped portion (remaining photoelectric conversion layer) 17 in the photoelectric conversion layer 5B For the active layer 51, which is a layer composing the photoelectric conversion layer 5, it is preferable to use the organic semiconductor material and the perovskite compound as described above. By using the active layer 51 made of these materials, the photoelectric conversion layer 5 that is sufficiently softer than the conductive layer 14 made of the above-described material can be formed, so that the stepped portion (remaining photoelectric conversion layer) 17 can be formed in the photoelectric conversion layer 5B more securely. Thus, it is possible to more securely obtain the second groove 12 with the bottom surface where the surface S1 of the photoelectric conversion layer 5B and the surface S2 of the conductive layer 14 are formed.

For example, Vickers hardness is used as a measure of hardness. Concretely, in the photoelectric conversion layer 5 using the organic material or the perovskite compound as the active layer 51, it is preferable to use the conductive layer 14 with a Vickers hardness of 5 or more to form the stepped portion (remaining photoelectric conversion layer) 17 in the photoelectric conversion layer 5B. Among the previously described concrete metal materials, bismuth, lead, and tin have the lowest Vickers hardness of about 5. In the case of a carbon material such as graphene or a metal-polymer composite or carbon-polymer composite, the Vickers hardness can be adjusted by selecting materials, adjusting the blending ratio, or the like, and, as in the case of the metal material, the hardness can be adjusted to about 5 or more. Applying such a conductive layer 14 makes it possible to form the stepped portion (remaining photoelectric conversion layer) 17 in the photoelectric conversion layer 5B when scribing the photoelectric conversion layer 5 that uses the organic material or the perovskite compound as the active layer to form the second groove 12.

The pressing condition and the scanning condition of the scribing blade 16 are set so that the electrode film 6X can be pattern-removed and the penetration depth of the scribing blade 16 is regulated at the surface of the conductive layer 14. For example, if the pressing pressure is too low, the frictional force between the surface of the electrode film 6X and the pressing surface of the scribing blade 16 decreases to cause sliding, failing to tear off the electrode film 6X. When the pressing pressure is too high, it is no longer possible to regulate the penetration depth of the scribing blade 16 at the position of the surface of the conductive layer 14. As a result, even the conductive layer 14 is scraped off, so that it becomes impossible to form the stepped portion (remaining photoelectric conversion layer) 17 in the photoelectric conversion layer 5B, which causes a risk that it is impossible to suppress the occurrence of a short circuit. Furthermore, when the pressing pressure is too high, the bottom electrode 4 and the substrate 2 may be cracked or scraped. When such a soft material as polymer is applied to the substrate 2 or such a brittle material as ITO is applied to the bottom electrode 4, the upper limit of the pressing pressure decreases and the optimal range of the scribing condition narrows. In such a case, the photoelectric conversion element 1 in the embodiment is preferable.

Incidentally, as a method of patterning of the electrode film 6X (P3 patterning), a method of using a mask vacuum film forming method in place of using the mechanical scribing method has been known. A vacuum film forming mask is placed in close contact with the patterned photoelectric conversion layer and an electrode material is deposited in this state by such a vacuum film forming method as vapor deposition or sputtering, to thereby form a pre-patterned counter electrode. In such a mask vacuum film forming method, the aforementioned problems of the mechanical scribing method do not occur, but there is a problem that the area ratio of a power generation portion (active area ratio), or the like decreases, and thereby, the photoelectric conversion efficiency decreases. There is explained a decrease in open area ratio. In the case of the mask vacuum film forming method, the P3 patterning is performed by arranging masking wires of the vacuum film forming mask on the portion where the top electrode is not formed. The width of the masking wires cannot be narrowed too much from the viewpoint of ensuring mechanical strength, and the lower limit is about several hundred micrometers. As a result that the width of the masking wires, namely the width of P3 is increased, the width of the photoelectric conversion part (active area) becomes narrow. As a result, there is a problem that the decrease in the area ratio of the power generation portion (active area ratio) results in a decrease in the photoelectric conversion efficiency. In the meantime, in the case of the mechanical scribing method, the width of the scribing blade is the width of P3, but it is relatively easy to reduce the width of the scribing blade to 100 µm or less, and thus, there are advantages of increasing the area ratio of the power generation portion (active area ratio) and easily improving the photoelectric conversion efficiency. Thus, in the photoelectric conversion element 1 in the embodiment, the mechanical scribing method is applied to prevent a short circuit between the bottom electrode 4B and the top electrode 6B, thereby achieving both the improvement in photoelectric conversion efficiency (the area ratio of the power generation portion) and the prevention of a short circuit.

As described above, the second groove 12 is provided so as to make the surface S1 of the photoelectric conversion layer 5B and the surface S2 of a part of the conductive layer 14 exposed. As described previously, the first groove 11 is provided so that the surface of a part of the conductive layer 14 is formed. That is, the conductive layer 14 is formed in a region ranging from the region where the first groove 11 is formed to a part of the region where the second groove 12 is formed. As illustrated in FIG. 5, the conductive layer 14 includes a first surface region SR1 exposed to the inside of the first groove 11 and a second surface region SR2 formed inside the second groove 12. The conductive layer 14 is formed in such a region as above, and thereby, it becomes possible to enhance the electrical connectivity between the top electrode 6A and the bottom electrode 4B by the connection part 13 composed of the top electrode material 15 provided inside the first groove 11 and the conductive layer 14, and to suppress the short circuit between the bottom electrode 4B and the top electrode 6B by the surface S1 of the photoelectric conversion layer 5B exposed to the portion inside the second groove 12, where the conductive layer 14 is not present.

The conductive layer 14 is formed in a region ranging from the region where the first groove 11 is formed to a part of the region where the second groove 12 is formed as described above. Although different materials or different layer configurations may be applied to the conductive layer located in the region where the first groove 11 is formed and to the conductive layer located in the region where a part of the second groove 12 is formed, or they may be formed in two separated locations, by forming the conductive layer 14 with the same material and the same layer configuration in a single location, the cost of materials or the number of steps can be reduced, resulting in that it is possible to achieve cost reduction of the photoelectric conversion element 1. Further, in the case where the top electrode 6A and the bottom electrode 4B are brought into direct contact with each other without forming the conductive layer 14 therebetween, galvanic corrosion is likely to occur, but interposing the conductive layer 14 between them also brings about the effect of improving such a problem. In order to improve the characteristics of the photoelectric conversion element 1, generally, materials that have a large difference in work function are selected for the bottom electrode 4 and the top electrode 6. It has been known that the materials having a large difference in work function come into contact with each other with moisture or the like intervening therebetween, and thereby the galvanic corrosion is likely to occur in the case of the combination of ITO and aluminum, for example. In contrast to this, by sandwiching molybdenum or the like, whose work function is between ITO and aluminum, as the conductive layer 14, the galvanic corrosion can be reduced and the series connection resistance can be lowered.

The thickness of the conductive layer 14 is preferably 15 nm or more. It is difficult to set a maximum surface roughness Rz of the pressing surface of the scribing blade 16 to 15 nm or less in terms of manufacturing process accuracy of the scribing blade 16. In the case where the thickness of the conductive layer 14 is less than 15 nm, even if the penetration depth of the scribing blade 16 is regulated at the position of the surface of the conductive layer 14, the most protruding portion of the pressing surface of the scribing blade 16 may come into contact with the bottom electrode 4B. As long as the thickness of the conductive layer 14 is 15 nm or more, the generation of a portion with no stepped portion (remaining photoelectric conversion layer) 17 formed therein is suppressed, thus making it possible to more effectively prevent a short circuit caused between the electrodes 4B and 6B. The thickness of the conductive layer 14 is more preferably 30 nm or more.

The width of the step surface S1 of the stepped portion (remaining photoelectric conversion layer) 17 in the photoelectric conversion layer 5B, namely a dimension A in FIG. 6 is preferably made larger than the thickness of the top electrode 6B. The burr 18b of the top electrode 6B may occur so as to hang down away from the side surface of the photoelectric conversion layer 5B, or may occur so as to adhere to the side surface of the photoelectric conversion layer 5B. In the case where the burr 18b is in close contact with the side surface of the photoelectric conversion layer 5B, the dimension A is made larger than the thickness of the top electrode 6B, thereby making it possible to prevent the contact of the burr 18b of the top electrode 6B with the conductive layer 14 and the short circuit between the top electrode 6B and the bottom electrode 4B through the conductive layer 14.

Further, the above-described dimension A is preferably set to 1 μm or more. Electrons and holes generated in the photoelectric conversion layer 5B are injected into the bottom electrode 4B and the top electrode 6B, and thereby power is extracted. When the dimension A is less than 1 μm, the electrons and the holes are not injected into the bottom electrode 4B or the top electrode 6B, but are injected into the conductive layer 14, which may make it no longer possible to extract power efficiently. When the perovskite compound is applied to the active layer 51, the perovskite compound may be transported for 1 μm or more due to having a high charge transportation property. From such a viewpoint, the dimension A is more preferably set to 5 μm or more.

The width of the conductive layer 14 formed inside the second groove 12, namely a dimension B in FIG. 6 is preferably set to 25 μm or more. As described previously, in order to regulate the penetration depth of the scribing blade 16 at the position of the surface of the conductive layer 14, the pressing position of the first end portion 16a of the scribing blade 16 needs to be on the conductive layer 14. From the viewpoint of mechanical accuracy and control accuracy of a scribing device, it is difficult to make the positioning accuracy of the pressing position of the scribing blade 16 fall within a range of about ±25 μm. In this regard, the pressing position of the scribing blade 16 is determined so that the dimension B becomes 25 μm or more, thereby making it possible to securely regulate the penetration depth of the scribing blade 16 at the surface of the conductive layer 14.

Further, the sum of the dimension A and the dimension B is preferably set to 30 μm or more and 1000 μm or less. The sum of the dimension A and the dimension B is equivalent to the width dimension of the scribing blade 16, but when considering the processing accuracy and the processing cost of the scribing blade 16 and the failure (failure strength of the scribing blade 16) during processing, the sum of the dimension A and the dimension B is preferably 30 μm or more. Further, the region of the dimension A and the dimension B is not the portion where the photoelectric conversion layer 5 is sandwiched between the top electrode 6 and the bottom electrode 4, namely, it is not the photoelectric conversion part, so that it is preferable to make this region narrow, and in order to keep the decrease in photoelectric conversion efficiency of the photoelectric conversion element 1 as a whole within an acceptable range, the sum of the dimension A and the dimension B is preferably set to 1000 μm or less.

According to the photoelectric conversion element 1 in the embodiment and the manufacturing method thereof, the short circuit between the top electrode 6B and the bottom electrode 4B, which is caused by the burr 18b of the top electrode 6B generated when scribing the electrode film 6X to be the top electrode 6, can be prevented by the shape of the second groove 12 that separates the top electrode 6A and the top electrode 6B from each other and the base layer (exposed surface) of the second groove 12. Further, the separation width between the top electrode 6A and the top electrode 6B can be narrowed, thus making it possible to increase the area contributing to photoelectric conversion. Furthermore, it is possible to enhance the electrical connectivity and the connection reliability between the top electrode 6A and the bottom electrode 4B. That is, it is possible to enhance the physical separability and the electrical connectivity among a plurality of the photoelectric conversion parts 3 together. Thus, it becomes possible to improve the photoelectric conversion efficiency of the photoelectric conversion element 1 with a plurality of the photoelectric conversion parts 3 connected in series.

Second Embodiment

FIG. 7 is a view illustrating a part of a photoelectric conversion element 21 in a second embodiment in an enlarged manner. The photoelectric conversion element 21 illustrated in FIG. 7 applies a high-hardness layer 22 in place of the conductive layer 14 in the first embodiment as a layer for regulating the penetration depth of the scribing blade at the separation part of the top electrode 6 to form the stepped portion (remaining photoelectric conversion layer) 17 in the photoelectric conversion layer 5B. That is, in the photoelectric conversion element 21 in the second embodiment, the high-hardness layer 22 is provided on the bottom electrode 4B apart from the conductive layer 14. The conductive layer 14 and the high-hardness layer 22 are arranged side by side. A material harder than that of the photoelectric conversion layer 5 only needs to be used for the high-hardness layer 22. The high-hardness layer 22 is not required to be conductive, so that the choice of materials is broader as compared to the first embodiment. In the case where a conductive material is used for the high-hardness layer 22, it is preferable to make the dimension A larger than the thickness of the top electrode 6B, as explained in the first embodiment. The photoelectric conversion element 21 has the same structure as in the first embodiment except for the differences from the first embodiment in the above enlarged view. Incidentally, the conductive layer 14 formed in a series connection part is not required and may be omitted.

Third Embodiment

FIG. 8 is a view illustrating a part of a photoelectric conversion element 31 in a third embodiment in an enlarged manner. The photoelectric conversion element 31 illustrated in FIG. 8 applies a high-hardness insulating layer 32 as a layer for regulating the penetration depth of the scribing blade at the separation part of the top electrode 6. The high-hardness insulating layer 32 is provided at a position corresponding to the stepped portion (remaining photoelectric conversion layer) 17 in the photoelectric conversion layer 5B in the first embodiment. A material having a Vickers hardness higher than that of the photoelectric conversion layer 5 only needs to be used for the high-hardness insulating layer 32. Then, the range where the high-hardness insulating layer 32 is formed is extended up to the photoelectric conversion part 3B side of the separation part of the top electrodes 6A, 6B, and thereby, the high-hardness insulating layer 32 itself plays a role in preventing a short circuit between the burr of the top electrode 6B and the bottom electrode 4B. Therefore, an insulating material is used for the high-hardness insulating layer 32. The photoelectric conversion element 31 has the same structure as in the first embodiment except for the differences from the first embodiment in the above enlarged view. Incidentally, the conductive layer 14 formed in a series connection part is not required and may be omitted.

EXAMPLES

Next, examples and their evaluation results will be described.

Example 1

First, a plurality of 150 nm-thick ITO films were formed as transparent electrodes, on a polyethylene terephthalate (PEN) substrate with a 125 μm thickness. The number of the ITO films formed was eight corresponding to the number of photoelectric conversion parts installed. That is, they were formed so as to correspond to an eight-series module. Then, on left edge portions of the eight ITO films, conductive layers each having a stacked structure of Mo and Au were formed. The Mo layer was used as an adhesive layer between the ITO layer and the Au layer. The conductive layers each had a width of about 0.5 mm and a thickness of 350 nm (50 nm of the Mo layer and 300 nm of the Au layer). The conductive layers were formed by a vacuum film forming method and were patterned by a photolithography method, and thereby they were each formed only at the edge portion of the ITO layer. Then, as the bottom electrode side intermediate layer, a film of poly(3,4-ethylenedioxythiophene)/poly(4-styrenesulfonate) (PEDOT/PSS) was formed. As PEDOT-PSS, Clevios AI4083 manufactured by Heraeus was used. The film thickness was set to about 50 nm.

Then, as the active layer, a perovskite layer was formed. As a method of forming the perovskite layer, what is called, a two-step method was used. As a coating solution or dispersion for the first step, a solution/dispersion obtained by dissolving/dispersing $PbI_2$ in a 1:1 mixed solvent of dimethylformamide (DMF) and dimethyl sulfoxide (DMSO) was used. As a coating solution/dispersion for the second step, a solution/dispersion obtained by dissolving/dispersing $CH_3NH_3I$ (MAI) in isopropyl alcohol (IPA) was used. After the two steps were finished, a heat treatment was performed at 120° C. for five minutes to form the active layer. The film thickness was set to 350 nm. Then, as the first top electrode side intermediate layer, a film of [60]PCBM ([6,6]-phenyl-C61-butyric acid methylester) was formed. As a solvent of [60]PCBM ink, monochlorobenzene was used. The [60]PCBM ink was applied and then allowed to dry naturally. The film thickness was set to about 50 nm.

Then, P2 patterning was performed by a mechanical scribing method. The P2 patterning was performed on the conductive layers with a width of about 0.5 mm. As the scribing blade, an 80 μm-wide cutting tool having a rectangular tip was used. In the mechanical scribing, the scribing blade was pressed by a suspension mechanism using a spring having a predetermined force and was scanned. The pressure of the scribing blade was set to 0.05 $mN/\mu m^2$. The three [60]PCBM layer, perovskite layer, and PEDOT·PSS layer were scraped off with almost no residue, and it was possible to make the conductive layers exposed.

Then, as the second top electrode side intermediate layer, a film of BCP (2,9-dimethyl-4,7-diphenyl-1,10-phenanthroline) with an about 20 nm thickness was formed by vacuum deposition. Then, as a counter electrode, an about 150 nm-thick film of Ag was formed by vacuum deposition.

Then, P3 patterning was performed by a mechanical scribing method. As the scribing blade, an 80 μm-wide cutting tool having a rectangular tip was used. The P3 patterning was performed on the right edge portions of the conductive layers with a width of about 0.5 mm. Concretely, the P3 patterning was performed by scanning the scribing blade while placing the scribing blade at a position where 40 μm of the left half of the 80 μm-wide scribing blade overlapped the right edge portion of the conductive layer and 40 μm of the right half of the scribing blade did not overlap the conductive layer. In the mechanical scribing, the scribing blade was pressed by the suspension mechanism using a spring having a predetermined force and was scanned. The pressure of the scribing blade was set to 0.03 $mN/\mu m^2$. As a result that P3 patterned portions were observed by a transmission microscope, it was confirmed that the Ag layer was pattern-removed as desired and the perovskite layer remained as desired. By the above steps, a photoelectric conversion element module with eight photoelectric conversion cells connected in series was manufactured.

Figure 9:
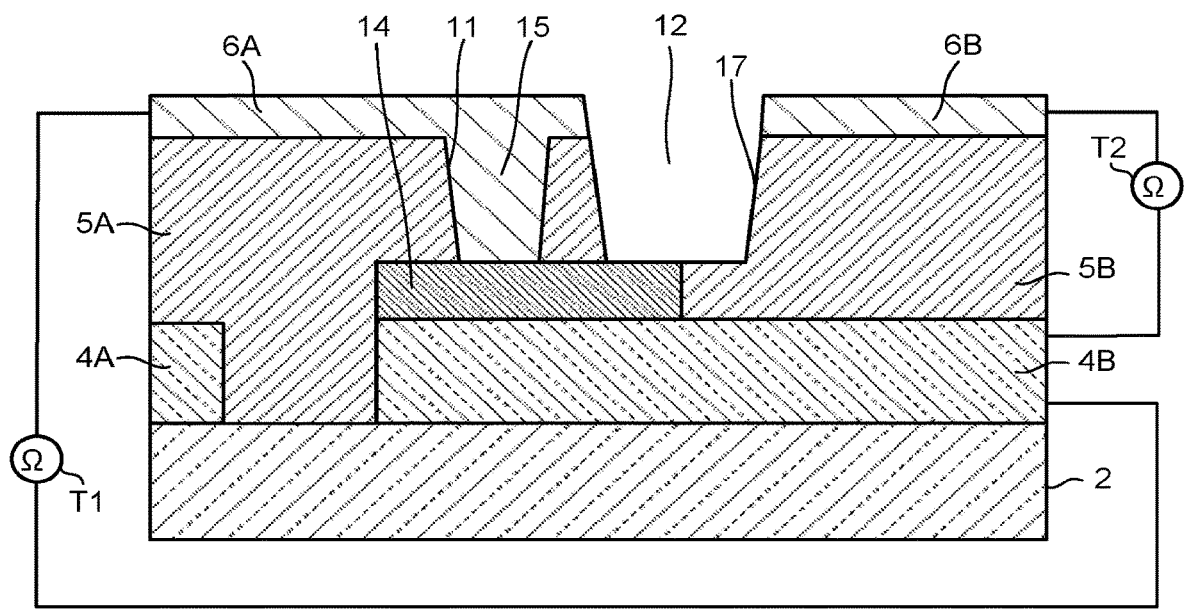
FIG. 9 is a view illustrating a measurement state of resistance values in a photoelectric conversion element in an example.

Regarding the above-described eight-series photoelectric conversion element module, as illustrated in FIG. 9, the resistance (series wiring resistance) of a series wiring portion passing through a P2 patterned portion was measured by a resistance measuring device T1. Incidentally, even when the polarity was reversed, substantially the same values were also obtained in all of the following measurement results of the series wiring resistance. When measuring the series wiring resistance, it is preferable to place the wiring as close to the series wiring portion as possible in order to minimize the effect of sheet resistance of an ITO electrode or an Ag electrode as much as possible. As a result that the series wiring resistance of the series wiring portion was measured at eight positions of the eight-series module, they were 0.3 to 0.5Ω, which were values low and good enough to have little adverse effect on the photoelectric conversion efficiency in operating as a photovoltaics. That is, a good P2 patterning property was obtained.

Then, regarding the eight-series photoelectric conversion element module, as illustrated in FIG. 9, interelectrode resistance of the photoelectric conversion part was measured by a resistance measuring device T2. The measurement was performed in the dark to reduce the effect of conductivity through the photoelectric conversion layer. Incidentally, even when the polarity was reversed, substantially the same values were also obtained in all of the following measurement results of the interelectrode resistance of the photoelectric conversion part. When measuring the interelectrode resistance of the photoelectric conversion part, it is preferable to place the wiring as close to the separation part of the top electrodes as possible in order to minimize the effect of sheet resistance of the ITO electrode or the Ag electrode as much as possible. As a result that the interelectrode resistances of the eight photoelectric conversion parts in the eight-series module were measured, a resistance value of 14 to 15 MΩ was obtained, which is sufficiently high and good value. It was confirmed that a burr of the top electrode (Ag electrode) did not come into contact with the bottom electrode (ITO electrode) to cause no short circuit. That is, a good P3 patterning property was obtained. Furthermore, using a solar simulator of AM 1.5 G and 1000 W/m$^2$, the photoelectric conversion efficiency of the fabricated series module was measured to be 10.5%. As described above, according to the example 1, a good series module with both a good P2 patterning property and a good P3 patterning property was obtained.

Example 2

A series module was fabricated and evaluated in the same manner as in the example 1 except that the thickness of the conductive layer made of a stack of the Mo layer and the Au layer was reduced to 20 nm (5 nm of the Mo layer and 15 nm of the Au layer). In the P2 patterning, the three [60] PCBM layer, perovskite layer, and PEDOT·SS layer were scraped off with almost no residue, and it was possible to make the conductive layers exposed. As a result that P3 patterned portions were observed by a transmission microscope, it was confirmed that the Ag layer was pattern-removed as desired and the perovskite layer remained as desired. The series wiring resistances were 0.3 to 0.5Ω, which were the same values as in the example 1. The resistance values are sufficiently low and good values with little adverse effect on the photoelectric conversion efficiency in operation as photovoltaics. As a result of the measurement of the interelectrode resistance of the photoelectric conversion part, a resistance value of 13 to 15 MΩ was obtained, which is sufficiently high and good value. It was confirmed that a burr of the top electrode (Ag electrode) did not come into contact with the bottom electrode (ITO electrode) to cause no short circuit. Furthermore, using a solar simulator of AM 1.5 G and 1000 W/m$^2$, the photoelectric conversion efficiency of the fabricated series module was measured to be 9.6%. As described above, a good series module with both a good P2 patterning property and a good P3 patterning property was obtained as in the example 1 even when the thickness of the conductive layer made of a stack of the Mo layer and the Au layer was reduced to 20 nm.

Reference Example 1

A series module was fabricated and evaluated in the same manner as in the example 1 except that the thickness of the conductive layer made of a stack of the Mo layer and the Au layer was further reduced to 10 nm (5 nm of the Mo layer and 5 nm of the Au layer). In the P2 patterning, the three [60]PCBM layer, perovskite layer, and PEDOT·PSS layer were scraped off with almost no residue, and it was possible to make the conductive layers exposed. As a result that P3 patterned portions were observed by a transmission microscope, it was confirmed that the Ag layer was pattern-removed as desired, but the perovskite layer was also pattern-removed. The series wiring resistances were 0.3 to 0.5Ω, which were the same values as in the example 1. The resistance values are sufficiently low and good values with little adverse effect on the photoelectric conversion efficiency in operation as photovoltaics. However, the interelectrode resistance of the photoelectric conversion part varied widely from 600 to 9 MΩ. There were also portions having a value of the interelectrode resistance as low as 600Ω, and thus, it was confirmed that a burr of the top electrode (Ag electrode) sometimes comes into contact with the bottom electrode (ITO electrode) to cause a short circuit. As a result, using a solar simulator of AM 1.5 G and 1000 W/m$^2$, the photoelectric conversion efficiency of the fabricated series module was measured to be 0.5%, which failed to obtain a practical value.

As above, when the thickness of the conductive layer made of a stack of the Mo layer and the Au layer was reduced to 10 nm, it was impossible to obtain a good series module. The perovskite layer in the P3 patterned portion has been pattern-removed, and thus, it is conceived as follows. The pressing surface of the scribing blade is not perfectly flat and has a surface roughness. When the thickness of the conductive layer is 15 nm or less, even if the penetration depth of the scribing blade is regulated at the position of the surface of the conductive layer, there is an increased risk that the most protruding portion of the pressing surface of the scribing blade will come into contact with the bottom electrode. As a result, it is conceived that a portion with no stepped portion (remaining photoelectric conversion layer) formed therein has been made to cause a short circuit. Thus, it is preferable to select the condition under which a uniform stepped portion (remaining photoelectric conversion layer) is formed.

Comparative Example 1

A series module was fabricated and evaluated in the same manner as in the example 1 except that the conductive layers were not provided. In the P2 patterning, residues of the three [60]PCBM layer, perovskite layer, and PEDOT·PSS layer were seen, failing to make the ITO layers exposed sufficiently. As a result that P3 patterned portions were observed by a transmission microscope, it was confirmed that the Ag layer was pattern-removed as desired, but the perovskite layer was also pattern-removed. The series wiring resistances were 83 to 117Ω, which were values high enough to adversely affect the photoelectric conversion efficiency in operation as photovoltaics. The interelectrode resistances of the photoelectric conversion parts were low values of 500 to 1500Ω, and it was confirmed that a burr of the top electrode (Ag electrode) came into contact with the bottom electrode (ITO electrode) to cause a short circuit. As a result, using a solar simulator of AM 1.5 G and 1000 W/m$^2$, the photoelectric conversion efficiency of the fabricated series module was measured to be 0.001%, which failed to obtain a practical value. As described above, it was impossible to obtain a good series module in the case of no conductive layers being provided.

Example 3

A series module was fabricated and evaluated in the same manner as in the example 1 except that the material of the conductive layer was replaced by a silver paste in which silver particle is dispersed in a solvent along with a binder (Product Name: D-500, Fujikura Kasei Co., Ltd) and the thickness of the conductive layer was increased to 5000 nm. The silver paste was applied by a dispenser and dried to form conductive layers. In the P2 patterning, the three [60]PCBM layer, perovskite layer, and PEDOT·PSS layer were scraped off with almost no residue, and it was possible to make the conductive layers exposed. As a result that P3 patterned portions were observed by a transmission microscope, it was confirmed that the Ag layer was pattern-removed as desired and the perovskite layer remained as desired. The series wiring resistances were 1.0 to 1.8Ω, which were low and good values with little adverse effect on the photoelectric conversion efficiency in operation as photovoltaics. As a result of the measurement of the interelectrode resistance of the photoelectric conversion part, they were high and good values of 14 to 15 MΩ, and it was confirmed that a burr of the counter electrode (Ag electrode) did not come into contact with the top electrode (ITO electrode) to cause no short circuit. Using a solar simulator of AM 1.5 G and 1000 W/m$^2$, the photoelectric conversion efficiency of the fabricated series module was measured to be 9.1%. As described above, even when the material of the conductive layer was replaced by a silver paste in which silver particle is dispersed in a solvent along with a binder (Product Name: D-500, Fujikura Kasei Co., Ltd) and the thickness of the conductive layer was increased, a good series module with both a good P2 patterning property and a good P3 patterning property was obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes may be made without departing from the spirit of the inventions. The accompanying claims and their equivalents are intended to cover such forms or modifications as would fall within the scope and spirit of the inventions.

What is claimed is:

1. A photoelectric conversion element comprising:
   a substrate;
   a first photoelectric conversion part including:
      a first bottom electrode provided on the substrate;
      a first photoelectric conversion layer arranged on the first bottom electrode; and
      a first top electrode arranged on the first photoelectric conversion layer;
   a second photoelectric conversion part including:
      a second bottom electrode provided on the substrate adjacently to the first bottom electrode and physically separated from the first bottom electrode;
      a conductive layer formed on a partial region of the second bottom electrode, adjacent to the first bottom electrode;
      a second photoelectric conversion layer arranged on the second bottom electrode and the conductive layer; and
      a second top electrode arranged on the second photoelectric conversion layer;
   a connection part that includes a first groove and a conductive portion,
      the first groove being provided to make a first surface region being a part of a surface of the conductive layer exposed and separating the first photoelectric conversion layer and the second photoelectric conversion layer from each other, and
      the conductive portion being formed of a part of the first top electrode, filled in the first groove,
      the connection part electrically connecting the first top electrode and the second bottom electrode via the conductive portion and the conductive layer; and
   a second groove provided to separate the first top electrode and the second top electrode from each other, the second groove making a step surface of a stepped portion provided on the first photoelectric conversion layer side in the second photoelectric conversion layer exposed and having a bottom surface thereof overlap a second surface region being a part of the surface of the conductive layer on the second photoelectric conversion layer side, wherein
   at least a part of the second surface region of the conductive layer is exposed to the inside of the second groove.

2. The photoelectric conversion element according to claim 1, wherein
   the conductive layer has a thickness of 15 nm or more.

3. The photoelectric conversion element according to claim 1, wherein
   a width of the step surface of the stepped portion in the second photoelectric conversion layer is longer than a thickness of the second top electrode.

4. The photoelectric conversion element according to claim 1, wherein
   a width of the second surface region of the conductive layer formed inside the second groove is 25 μm or more.

5. The photoelectric conversion element according to claim 1, wherein
   the first photoelectric conversion layer and the second photoelectric conversion layer include an active layer; and the conductive layer is harder than the active layer.

6. The photoelectric conversion element according to claim 1, wherein
   the first photoelectric conversion layer and the second photoelectric conversion layer include an active layer, and the active layer contains an organic semiconductor or a perovskite compound having a composition expressed by ABX$_3$ wherein A is a monovalent cation, is a divalent cation, and X is a monovalent anion, and
   the conductive layer includes at least one layer selected from a metal material layer containing at least one metallic element selected from the group consisting of aluminum, gold, silver, copper, platinum, bismuth, lead, tin, zinc, iron, cobalt, nickel, titanium, zirconium, molybdenum, tungsten, chromium, and tantalum, a carbon material layer, a metal-polymer composite layer in which a powder of the metallic element is dispersed in a polymeric material, and a carbon-polymer composite layer in which a powder of a carbon material is dispersed in a polymeric material.

7. The photoelectric conversion element according to claim 1, wherein
the first top electrode and the second top electrode contain at least one selected from a metal material containing at least one metallic element selected from the group consisting of aluminum, gold, silver, copper, platinum, indium, bismuth, lead, tin, zinc, iron, cobalt, nickel, titanium, zirconium, molybdenum, tungsten, chromium, and tantalum, a carbon material, a metal-polymer composite in which a powder of the metallic element is dispersed in a polymeric material, and a carbon-polymer composite in which a powder of the carbon material is dispersed in a polymeric material.

8. The photoelectric conversion element according to claim 1, wherein
the substrate is a transparent substrate containing at least one soft material selected from the group consisting of polyethylene, polyethylene terephthalate, polyethylene naphthalate, polyimide, polyamide, polyamide-imide, and a liquid crystal polymer, and
the first bottom electrode and the second bottom electrode are a transparent electrode containing at least one selected from the group consisting of indium oxide, zinc oxide, tin oxide, indium tin oxide, fluorine-doped tin oxide, gallium-doped zinc oxide, aluminum-doped zinc oxide, indium-zinc oxide, indium-gallium-zinc oxide, poly(3,4-ethylenedioxythiophene)/poly(4-styrenesulfonate), and graphene.

9. A manufacturing method of a photoelectric conversion element comprising:
forming, on a substrate, a first bottom electrode and a second bottom electrode, the second bottom electrode adjacent to the first bottom electrode and physically separated from the first bottom electrode;
forming a conductive layer on a partial region, of the second bottom electrode, adjacent to the first bottom electrode;
forming, on the substrate, a photoelectric conversion layer to cover the first bottom electrode, the second bottom electrode, and the conductive layer;
scribing the photoelectric conversion layer along a formation region of the conductive layer and forming a first groove that makes a first surface region being a part of a surface of the conductive layer exposed while dividing the photoelectric conversion layer into a first photoelectric conversion layer and a second photoelectric conversion layer;
forming an electrode film on the photoelectric conversion layer divided by the first groove and filling a part of the electrode film in the first groove to electrically connect the electrode film and the second bottom electrode via the conductive layer; and
scribing the electrode film and a part of the second photoelectric conversion layer on the first photoelectric conversion layer side in a thickness direction and forming a second groove that divides the electrode film into a first top electrode and a second top electrode, makes a surface of the scribed part of the second photoelectric conversion layer in the thickness direction exposed, and has a bottom surface thereof overlap a second surface region being a part of the surface of the conductive layer on the second photoelectric conversion layer side, wherein
the second groove is formed to make at least a part of the second surface region of the conductive layer exposed.

10. The manufacturing method of the photoelectric conversion element according to claim 9, wherein
the photoelectric conversion layer includes an active layer, and the conductive layer is harder than the active layer.

11. The manufacturing method of the photoelectric conversion element according to claim 9, wherein
the photoelectric conversion layer includes an active layer, and the active layer contains an organic semiconductor or a perovskite compound having a composition expressed by $ABX_3$ wherein A is a monovalent cation, B is a divalent cation, and X is a monovalent anion, and
the conductive layer includes at least one layer selected from a metal material layer containing at least one metallic element selected from the group consisting of aluminum, gold, silver, copper, platinum, bismuth, lead, tin, zinc, iron, cobalt, nickel, titanium, zirconium, molybdenum, tungsten, chromium, and tantalum, a carbon material layer, a metal-polymer composite layer in which a powder of the metallic element is dispersed in a polymeric material, and a carbon-polymer composite layer in which a powder of a carbon material is dispersed in a polymeric material.

12. The manufacturing method of the photoelectric conversion element according to claim 9, wherein
the second groove is formed by mechanical scribing the electrode film and a part of the second photoelectric conversion layer.

* * * * *